(12) United States Patent
Zuo et al.

(10) Patent No.: US 10,893,622 B2
(45) Date of Patent: Jan. 12, 2021

(54) COVER PLATE FOR FLEXIBLE DISPLAY SCREEN AND FLEXIBLE DISPLAY SCREEN

(71) Applicant: Wuhan China Star Optoelectronics Semiconductor Display Technology Co., Ltd., Wuhan (CN)

(72) Inventors: Fei Zuo, Wuhan (CN); Jing Wang, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 16/347,888

(22) PCT Filed: Nov. 14, 2018

(86) PCT No.: PCT/CN2018/115449
§ 371 (c)(1),
(2) Date: May 7, 2019

(87) PCT Pub. No.: WO2020/062482
PCT Pub. Date: Apr. 2, 2020

(65) Prior Publication Data
US 2020/0146165 A1    May 7, 2020

(30) Foreign Application Priority Data

Sep. 25, 2018  (CN) .......................... 2018 1 1119744

(51) Int. Cl.
*G06F 3/02* (2006.01)
*H05K 5/03* (2006.01)
*H05K 5/00* (2006.01)

(52) U.S. Cl.
CPC ............ *H05K 5/03* (2013.01); *H05K 5/0017* (2013.01)

(58) Field of Classification Search
CPC ........................................................ H05K 5/03
See application file for complete search history.

(56) References Cited

U.S. PATENT DOCUMENTS

| | | | |
|---|---|---|---|
| 2005/0164752 A1* | 7/2005 | Lau | H04M 1/0247 455/575.3 |
| 2009/0201434 A1 | 8/2009 | Yuzawa | |
| 2010/0246103 A1 | 9/2010 | Visser et al. | |

(Continued)

FOREIGN PATENT DOCUMENTS

| CN | 105912074 | 1/1800 |
|---|---|---|
| CN | 201156373 | 11/2008 |

(Continued)

*Primary Examiner* — Jerry Wu (57) ABSTRACT

The present application provides a cover plate for a flexible display screen and a flexible display screen, the cover plate comprises deformable regions and non-deformable regions spaced apart along a first direction, the deformable regions comprising memory metal for connecting the non-deformable regions, the number of the non-deformable regions is not less than four; wherein, when the memory metal of the deformable regions is in a low temperature phase shape, the projections of the non-deformable regions at least partially overlaps in a direction perpendicular to the display screen; when the memory metal of the deformable regions is in a high temperature phase shape, the deformable regions and the non-deformable regions are on a same horizontal plane.

16 Claims, 6 Drawing Sheets

(56) References Cited

U.S. PATENT DOCUMENTS

| | | | | |
|---|---|---|---|---|
| 2011/0095975 A1* | 4/2011 | Hwang | ................... | G06F 3/016 |
| | | | | 345/156 |
| 2015/0227248 A1* | 8/2015 | Yamazaki | ................ | G09G 3/20 |
| | | | | 345/173 |
| 2016/0299283 A1 | 10/2016 | Yu et al. | | |

FOREIGN PATENT DOCUMENTS

| | | |
|---|---|---|
| CN | 101504509 | 8/2009 |
| CN | 104006357 | 8/2014 |
| CN | 205015806 | 2/2016 |
| CN | 105947182 | 9/2016 |
| CN | 106065948 | 11/2016 |
| CN | 106917814 | 7/2017 |
| CN | 107195253 | 9/2017 |
| CN | 107437378 | 12/2017 |

* cited by examiner

COVER PLATE FOR FLEXIBLE DISPLAY SCREEN AND FLEXIBLE DISPLAY SCREEN

RELATED APPLICATIONS

This application is a National Phase of PCT Patent Application No. PCT/CN2018/115449 having International filing date of Nov. 14, 2018, which claims the benefit of priority of Chinese Patent Application No. 201811119744.X filed on Sep. 25, 2018. The contents of the above applications are all incorporated by reference as if fully set forth herein in their entirety.

FIELD AND BACKGROUND OF THE INVENTION

The present invention relates to the field of display technologies, and in particular, to a cover plate for flexible display screen and a flexible display screen.

With the continuous development of LED technology, flexible displays have become popular. In the prior art, a plurality of LED display unit blocks are usually spliced and assembled by a curved bracket or a hinge structure to form a display screen capable of performing deformation such as bending and unfolding.

However, curved brackets or hinge structures have the following disadvantages:

1. The precision of the mounting accuracy of the curved brackets or the hinge structures is high, and the weight of the flexible display screen is heavy, therefore the mechanical assembly is difficult to implement and the cost is high.

2. Since the degree of deformation of the curved brackets or the hinge structures is limited by its own mechanical structure, the flexible display screen made by such a connection cannot achieve a large deformation; at the same time, the splicing smoothness of the adjacent display units is poor, which will weaken the display effect of the display screen.

3. The structures of the curved brackets or the hinge structures are limited, therefore the screens connected by this methods have a limited shape and a low ductility.

SUMMARY OF THE INVENTION

The present application provides a cover plate for a flexible display screen and a flexible display screen, which enables a flexible display screen using the cover plate to realize automatic folding, bending, and unfolding functions.

Specifically, the technical solution of the present application is as follows:

The present application provides a cover plate for a flexible display screen, wherein the cover plate comprises deformable regions and non-deformable regions spaced apart along a first direction, the deformable regions comprising memory metal for connecting the non-deformable regions, the number of the non-deformable regions is not less than four; wherein, when the memory metal of the deformable regions is in a low temperature phase shape, the projections of the non-deformable regions at least partially overlaps in a direction perpendicular to the display screen; when the memory metal of the deformable regions is in a high temperature phase shape, the deformable regions and the non-deformable regions are on a same horizontal plane; wherein, the memory metal of the deformable regions comprising a mesh structure and/or a fence structure.

According to one aspect of the present application, the cover plate comprises at least a first non-deformable region, a first deformable region, a second non-deformable region, a second deformable region, a third non-deformable region, a third deformable region, and a fourth non-deformable region, which are sequentially arranged along the first direction.

According to one aspect of the present application, when the memory metal of the first deformable region, the second deformable region, and the third deformable region is in a low temperature phase shape, the projections of the first non-deformable region, the second non-deformable region, the third non-deformable region, and the fourth non-deformable region completely overlap in a direction perpendicular to the display screen.

According to one aspect of the present application, when the memory metal of the first deformable region, the second deformable region, and the third deformable region is in a low temperature phase shape, the first non-deformable region, the second non-deformable region, the third non-deformable region and the fourth non-deformable region are "S"-shaped folded, the first non-deformable region at the head end of the cover plate and the fourth non-deformable region at the tail end of the cover plate are exposed to the outside.

According to one aspect of the present application, when the memory metal of the first deformable region, the second deformable region, and the third deformable region is in a low temperature phase shape, the first non-deformable region, the second non-deformable region, the third non-deformable region and the fourth non-deformable region are "C"-shaped folded, the second non-deformable region and the third non-deformable region located in the middle of the cover plate are exposed to the outside.

According to one aspect of the present application, the first deformable region, the second deformable region, and the third deformable region have the same length in the first direction.

According to one aspect of the present application, the first deformable region, the second deformable region, and the third deformable region are different in length in the second direction, wherein the second direction is in the same plane with and perpendicular to the first direction.

According to one aspect of the present application, at least one of the first deformable region, the second deformable region, and the third deformable region is composed of two or more sub-deformation regions, gaps are existed between the sub-deformation regions, and the widths of the gaps are greater than 1 mm.

The present application further provides a cover plate for a flexible display screen, wherein, the cover plate comprises deformable regions and non-deformable regions spaced apart along a first direction, the deformable regions comprising memory metal for connecting the non-deformable region, the number of the non-deformable regions is not less than four; wherein, when the memory metal of the deformable regions is in a low temperature phase shape, the projections of the non-deformable regions at least partially overlaps in a direction perpendicular to the display screen; when the memory metal of the deformable regions is in a high temperature phase shape, the deformable regions and the non-deformable regions are on a same horizontal plane.

According to one aspect of the present application, the cover plate comprises at least a first non-deformable region, a first deformable region, a second non-deformable region, a second deformable region, a third non-deformable region, a third deformable region, and a fourth non-deformable region, which are sequentially arranged along the first direction.

According to one aspect of the present application, when the memory metal of the first deformable region, the second deformable region, and the third deformable region is in a low temperature phase shape, the projections of the first non-deformable region, the second non-deformable region, the third non-deformable region, and the fourth non-deformable region completely overlap in a direction perpendicular to the display screen.

According to one aspect of the present application, when the memory metal of the first deformable region, the second deformable region, and the third deformable region is in a low temperature phase shape, the first non-deformable region, the second non-deformable region, the third non-deformable region and the fourth non-deformable region are "S"-shaped folded, the first non-deformable region at the head end of the cover plate and the fourth non-deformable region at the tail end of the cover plate are exposed to the outside.

According to one aspect of the present application, when the memory metal of the first deformable region, the second deformable region, and the third deformable region is in a low temperature phase shape, the first non-deformable region, the second non-deformable region, the third non-deformable region and the fourth non-deformable region are "C"-shaped folded, the second non-deformable region and the third non-deformable region located in the middle of the cover plate are exposed to the outside.

According to one aspect of the present application, the first deformable region, the second deformable region, and the third deformable region have the same length in the first direction.

According to one aspect of the present application, the first deformable region, the second deformable region, and the third deformable region are different in length in the second direction, wherein the second direction is in the same plane with and perpendicular to the first direction.

According to one aspect of the present application, at least one of the first deformable region, the second deformable region, and the third deformable region is composed of two or more sub-deformation regions, gaps are existed between the sub-deformation regions, and the width of the gaps are greater than 1 mm.

According to one aspect of the present application, the memory metal of the deformable regions comprising a mesh structure and/or a fence structure.

The present application also provides a flexible display screen, wherein, comprises a cover plate, the cover plate comprises deformable regions and non-deformable regions spaced apart along a first direction, the deformable regions comprising memory metal for connecting the non-deformable regions, the number of the non-deformable regions is not less than four; wherein, when the memory metal of the deformable regions is in a low temperature phase shape, the projections of the non-deformable regions at least partially overlaps in a direction perpendicular to the display screen; when the memory metal of the deformable regions is in a high temperature phase shape, the deformable regions and the non-deformable regions are on a same horizontal plane.

The advantageous effects of the application comprises: by using memory metal to form deformable regions in the cover plate, the cover plate of the present application can realize the functions of automatic folding, bending and unfolding of any shape, and can realize complicated deformation that cannot be implemented by other mechanical structures such as hinges.

DESCRIPTION OF SPECIFIC EMBODIMENTS OF THE INVENTION

The description of following embodiment, with reference to the accompanying drawings, is used to exemplify specific embodiments which could be carried out in the present disclosure. Directional terms mentioned in the present disclosure, such as "top", "bottom", "front", "back", "left", "right", "inside", "outside", "side", etc., are only used with reference to the orientation of the accompanying drawings. Therefore, the used directional terms are intended to illustrate, but not to limit, the present disclosure. In the drawings, the components having similar structures are denoted by same numerals.

The cover plate provided by the present application and the flexible display panel using the cover plate will be described in detail below with reference to the accompanying drawings.

The present application provides a cover plate for a flexible display screen, wherein the cover plate comprises deformable regions and non-deformable regions spaced apart along a first direction, the deformable regions comprising memory metal for connecting the non-deformable regions, the number of the non-deformable regions is not less than four; wherein, when the memory metal of the deformable regions is in a low temperature phase shape, the projections of the non-deformable regions at least partially overlaps in a direction perpendicular to the display screen; when the memory metal of the deformable regions is in a high temperature phase shape, the deformable regions and the non-deformable regions are on a same horizontal plane.

The present application utilizes the two-way memory effect of the memory metal, that is, when the temperature is above the metamorphic temperature, the memory metal is in the shape of a high temperature phase, and when the temperature is below the metamorphic temperature, the memory metal is in the shape of a low temperature phase. The shape memory effect is due to martensitic transformation. The martensitic transformation can be caused by temperature or by external stress. The phase change caused by stress is called stress-induced martensitic transformation. The phase change temperature is linear with stress. After the external force is removed, the deformation of the memory metal will recover. This feature ensures that the strain of the memory metal has a strong recovery capacity even after stress unloading. In the present application, the folded or bent state of the cover plate depends on the shape of the memory metal memorized during the heat treatment, any shape can be realized, which cannot achieve by hinges.

The present application uses the memory metal for the flexible display cover plate, so that the flexible display can be folded, bent and unfolded automatically under certain conditions.

In the present application, the materials of memory metal comprises but not limited to nickel titanium alloy, Au—Cd alloy, Ag—Cd alloy, Cu—Zn alloy, Cu—Zn—Al alloy, Cu—Zn—Sn alloy, Cu—Zn—Si alloy, Cu—Sn alloy, Cu—Zn—Ga alloy, In—Ti alloy, Au—Cu—Zn alloy, NiAl alloy, Fe—Pt alloy, Ti—Ni alloy, Ti—Ni—Pd alloy, Ti—Nb alloy, U—Nb alloy, and Fe—Mn—Si alloy, alloys of different content ratios such as Cu—Al—Ni are comprised as well.

Memory metal has certain ductility, the structure provided by the present application makes the certain part of the structure have good ductility in the case of folding, and the part presets a certain space when being bent, to avoid wrinkles of the flexible display when bent.

Specifically, the non-deformable regions could be composed of various non-deformable rigid materials such as metal, plastic, ceramic, glass, and the like. The deformable regions are composed of memory metal. The memory metal has a two-way memory effect with a high temperature phase shape and a low temperature phase shape. When at or above the metamorphic temperature, the memory metal maintains a high temperature phase shape, which is typically is unfolded; when below the metamorphic temperature, the memory metal recovers to the low temperature phase shape, which is typically is folded. Deformation of the deformable regions can be achieved by controlling the temperature of the cover plate, thereby realizing the deformation of the cover plate and the flexible display panel using the cover plate.

In practice, the temperature of the cover plate can be controlled in different ways. One way is to add a temperature adjustment unit to the display, including a controller and heating elements. The position of the heating elements corresponds to the position of the memory metal. After receiving a deformation signal, the controller controls the heating elements to heat the memory metal. Therefore, the temperature is raised above the metamorphic temperature, and the shape of the deformable region is converted from a low temperature phase to a high temperature phase, thereby the deformation is completed to achieve the opening, folding and other operations of the screen. One disadvantage of this method is that the memory metal is difficult to cool when it is required to recover from the high temperature phase to the low temperature phase, which is not convenient for control. Therefore, this method is mostly used for large outdoor display devices, and is not suitable for handheld devices that are frequently used, such as smart phones, tablets, and the like.

Another possible way is to adjust the metamorphic temperature of the memory metal to about 37° C., which is the same as the temperature of the human body. When in a non-use state, the temperature of the display screen is equal to room temperature and typically does not exceed 35° C. At this time, the cover plate is in a low temperature phase, that is, in a folded state. When the user holds and uses the display screen, the cover plate is heated to the same temperature as the human body, and the display is unfolded. When being used, even if the user's palm or body leaves the cover plate, the temperature of the memory metal will continue to be above the metamorphic temperature and being unfolded due to the heat generated by components of the display during operation. When it is not needed, the display stops heating and the user's palm leaves the cover plate, the temperature of the memory metal quickly falls back below the metamorphic temperature and returns to the folded state again. In the prior art, the nickel-titanium alloy and the Cu—Al—Ni alloy can achieve a metamorphic temperature of about 37° C., which is a common technical solution in the art, and will not be described herein. In practice, a suitable method can be selected to control the temperature of the deformable region of the cover plate as needed.

Specific embodiments of the present application will be described in detail below with reference to the accompanying drawings.

Figure 1:
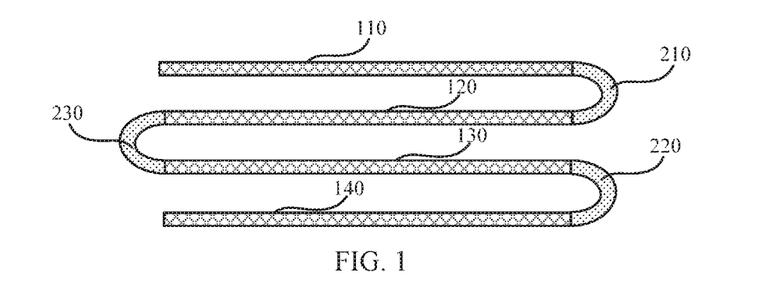
FIG. 1 is a structure diagram of a cover plate in a folded state according to a first embodiment of the present application.

FIG. 1 is a structure diagram of a cover plate in a folded state according to a first embodiment of the present application, as shown in FIG. 1, the cover plate comprises a first non-deformable region 110, a first deformable region 210, a second non-deformable region 120, a second deformable region 220, a third non-deformable region 130, a third deformable region 230, and the fourth non-deformable region 240 which are sequentially arranged along a first direction. Specifically, when the memory metal of the first deformable region 210, the second deformable region 220, and the third deformable region 230 is in a low temperature phase shape, the projections of the first non-deformable region 110, the second non-deformable region 120, the third non-deformable region 130, and the fourth non-deformable region 140 in a direction perpendicular to the display screen completely overlap, that is, the display screen is in a folded state.

Figure 6A:
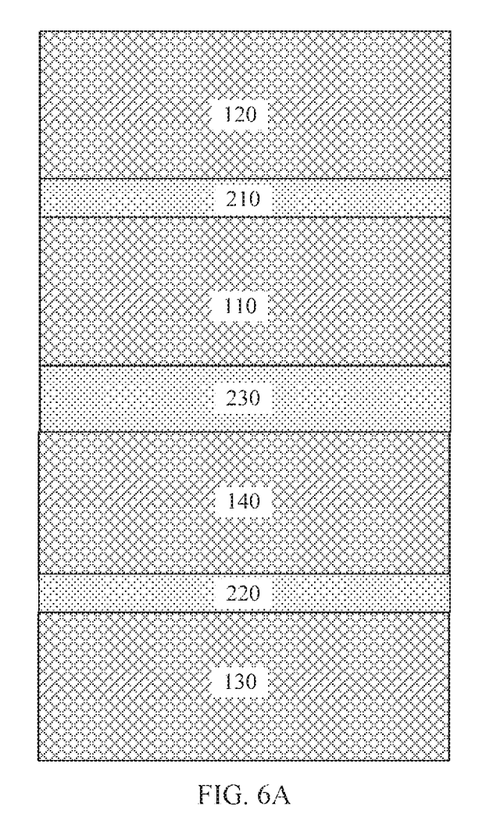
FIG. 6A is a structure diagram of a cover plate in a first unfolded state in the first embodiment of the present application.
Figure 6B:
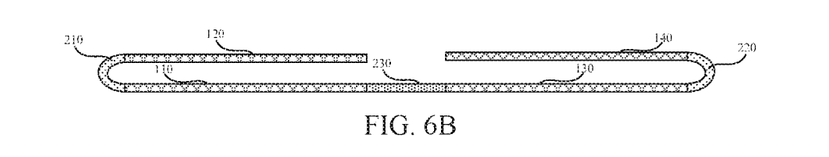
FIG. 6B is a structure diagram of the cover plate in a second unfolded state in the first embodiment of the present application.

Preferably, the first non-deformable region 110, the second non-deformable region 120, the third non-deformable region 130, and the fourth non-deformable region 140 have a same shape, and their unfolded state is shown in FIG. 6. In other embodiments, the first non-deformable region 110, the second non-deformable region 120, the third non-deformable region 130, and the fourth non-deformable region 140 could also have different shapes as needed. The non-deformable regions could take any desired shape, and the embodiments in the present application are only a part of them and are not to be construed as a limit of the present application.

In this embodiment, when the memory metal of the first deformable region 210, the second deformable region 220, and the third deformable region 230 is in a low temperature phase shape, the first non-deformable region 110, the second non-deformable region 120, the third non-deformable region 130, and the fourth non-deformable region 140 are "S"-shaped folded. The first non-deformable region 110 at the heading end of the cover plate and a fourth non-deformable region 140 at the trailing end of the cover plate are exposed to the outside. As shown in FIG. 1, the projections of the first non-deformable region 110, the second non-deformable region 120, the third non-deformable region 130, and the fourth non-deformable region 140 completely overlap in a direction perpendicular to the display screen, the display screen is in a folded state and takes up minimal space.

Figure 2A:
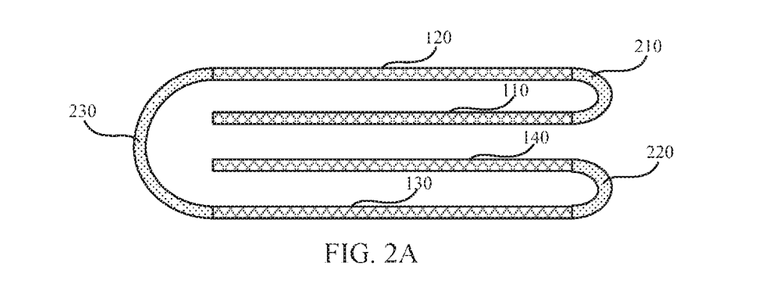
FIG. 2A is a structure diagram of a cover plate in a folded state according to a second embodiment of the present application.

FIG. 2A shows the second embodiment of the present application, wherein, when the memory metal of the first deformable region 210, the second deformable region 220, and the third deformable region 230 is in a low temperature phase shape, the first non-deformable region 110, the second non-deformable region 120, the third non-deformable region 130, and the fourth non-deformable region 140 are "C"-shaped folded. The second non-deformable region 120 located in the middle of the cover plate and the third non-deformable region 130 located in the middle of the cover plate are exposed to the outside.

The advantages of a "C"-shaped folding state compared to an "S"-shaped folding state include: the non-deformable regions at the heading and trailing ends of the cover plate are hidden inside when folded, which means under a folded state, the edges of the heading and trailing ends are protected in a housing consisting of the second non-deformable region 120 and the third non-deformable region 130 located in the middle of the cover plate. But at the same time, in the "C"-shaped folding state, the display surface of the display is completely wrapped inside the cover plate, and the standby display cannot be realized. Furthermore, when being "C"-shaped folded, the length of the second deformable region 220 in the first direction is greater than the length of the first deformable region 210 and the third deformable region 230, in the case where the total length of the cover plate is the same, the deformable regions composed of the memory metal occupies a larger region and the cost is relatively higher.

When being "S"-shaped folded, the display surface of the display corresponding to the non-deformable regions of the heading end and the tailing end of the cover plate are exposed to the outside, and the standby display can be realized. And the lengths of the first deformable region 210, the second deformable region 220, and the third deformable region 230 are the same in the first direction. In practical applications, the appropriate structure can be selected as needed.

Figure 2B:
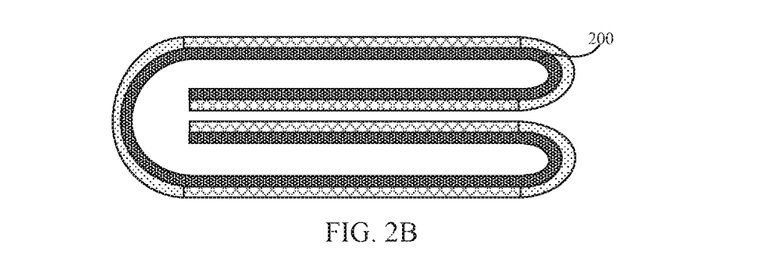
FIG. 2B is a structure diagram of a display screen to which the cover plate of FIG. 2 (a) is applied.

FIG. 2B is a structure diagram of a display screen to which the cover plate of FIG. 2A is applied. Referring to FIG. 2B, when the memory metal in the cover plate is in a low temperature phase shape, the display screen is folded. Compared with the unfolded state, the area occupied by the display screen in the folded state is significantly reduced, which is convenient for storage and carrying. Taking a flat computer as an example, a flat computer using the flexible display screen of the present application can be bent as shown in FIG. 2B. Since thickness of the flat computer is small, the bent flat computer occupies only a quarter of the original size and can be carried in a pocket. When used, it only needs to be open by hand through body temperature, which is convenient to operate and optimizes the users' experience.

In the present application, the shape and proportion of the deformable regions and the non-deformable regions can be adjusted according to practice. Generally, in order to save cost, we only set the memory metal to form deformable regions where deformation is required, and the area of the deformable regions is much smaller than the non-deformable regions, so that the cost of the flexible display panel is maximized. In practice, the area of the deformable regions could also be greater than or equal to the non-deformable regions for other considerations, such as to achieve a more complex deformation. The proportional relationship and shape of the deformable regions and the non-deformable regions are not to be construed as a limit of the application.

Figure 3:
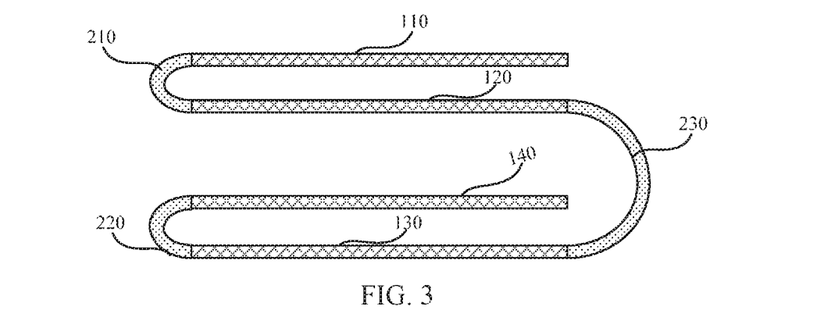
FIG. 3 is a structure diagram of a cover plate in a folded state according to a third embodiment of the present application.

FIG. 3 is a structure diagram of a cover plate in a folded state according to a third embodiment of the present application, wherein, when the memory metal of the first deformable region 210, the second deformable region 220, and the third deformable region 230 is in a low temperature phase shape, the first non-deformable region 110 and the second non-deformable region 120 are folded in an "S"-shape, and the second non-deformable region 120 and the third non-deformable region 130 are folded in a "C"-shape. The third non-deformable region 130 and the fourth non-deformable region 140 are folded in an "S"-shape. A first non-deformable region 110 between the leading ends of the cover and a third non-deformable region 130 located in the middle of the cover plate are exposed to the outside.

The above embodiments illustrate the connection ways of the non-deformable regions and the deformable regions in present application. In practice, any feasible connection structure can be used as needed. The above embodiments are not to be construed as a limit of the application. Further, in the drawings of the above embodiments, the cross section of the deformable regions in the folded state is arc, in practical applications, the cross-sectional of the deformable regions in the folded state could also be other shapes such as a triangle, a polygon, etc., and the cross-sectional shape of the deformable regions is also not to be construed as a limit of the present application.

Likewise, the length, shape and number of non-deformable regions are not to be construed as a limit of the application.

Figure 4:
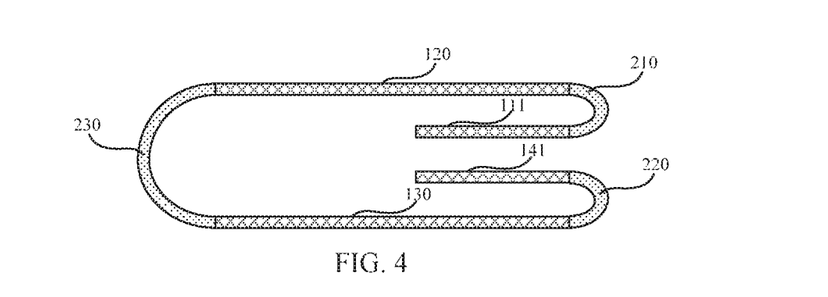
FIG. 4 is a structure diagram of a cover plate in a folded state in a fourth embodiment of the present application.

In practice, the positions of the foldable regions and the non-foldable regions can be set as needed, and the shapes of the non-deformable regions can also be different from each other to meet the needs of the user's. Referring to FIG. 4, FIG. 4 shows a fourth embodiment of the present application, wherein, when the memory metal of the first deformable region 210, the second deformable region 220, and the third deformable region 230 is in a low temperature phase shape, the first to fourth deformable regions are folded in a "C"-shape, and the lengths of the first non-deformable region 111 and the fourth non-deformable region 141 are smaller than the lengths of the second non-deformable region 120 and the third non-deformable region 130.

Figure 5:
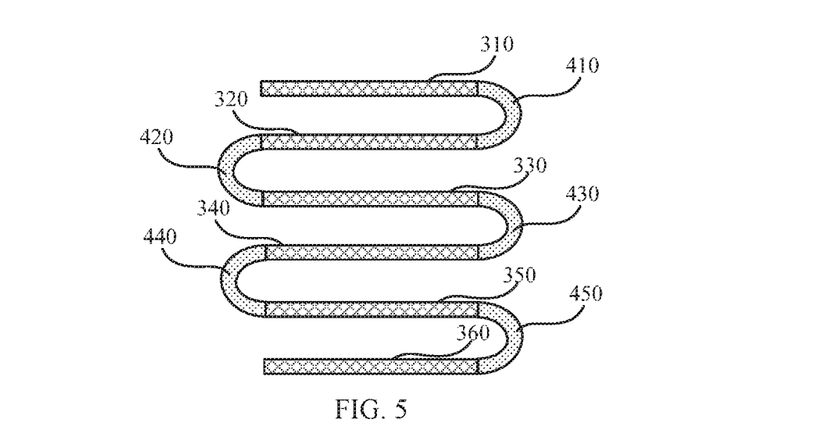
FIG. 5 is a schematic view showing the structure of the cover plate in a folded state in a fifth embodiment of the present application.

For a flexible display having a large area, such as a liquid crystal television, in order to further reduce the area in a folded state, a plurality of deformable regions and non-deformable regions could be provided. FIG. 5 shows a fifth embodiment of the present application, wherein the cover plate includes a first non-deformable region 310, a second non-deformable region 320, a third non-deformable region 330, a fourth non-deformable region 340, a fifth non-deformable region 350, and a sixth non-deformable region 360, and a first deformable region 410, a second deformable region 420, a third deformable region 430, a fourth deformable region 440, and a fifth deformable region 450. The first to sixth deformable regions are "S"-shaped folded when the memory metal of the first to fifth deformable regions is in a low temperature phase shape. In the application, the length, shape and number of the non-deformable regions and the deformable regions can be adjusted as needed.

In the present application, the cover plate could be fully deployed, in a first deployed state, or could be partially deployed, in a second deployed state. The length of the deformable regions in the second direction could be same or different. The second direction is in the same plane as the first direction and is perpendicular to each other.

FIG. 6A is a structure diagram of a cover plate in a first unfolded state in the first embodiment of the present application, the three deformable regions have the same shape and are both in the shape of a high temperature phase, and the four non-deformable regions also have the same shape. FIG. 6B is a structure diagram of the cover plate in a second unfolded state in the first embodiment of the present application, in the second unfolded state, only the third deformable region 230 is in the high temperature phase, while the first deformable region 210 and the second deformable region 220 are both in a low temperature phase, and the display screen is half open. The cover plate could also have a third expanded state in which the first deformable region 210 and the second deformable region 220 in a high temperature phase, and a third deformable region 230 in a low temperature phase.

Figure 7:
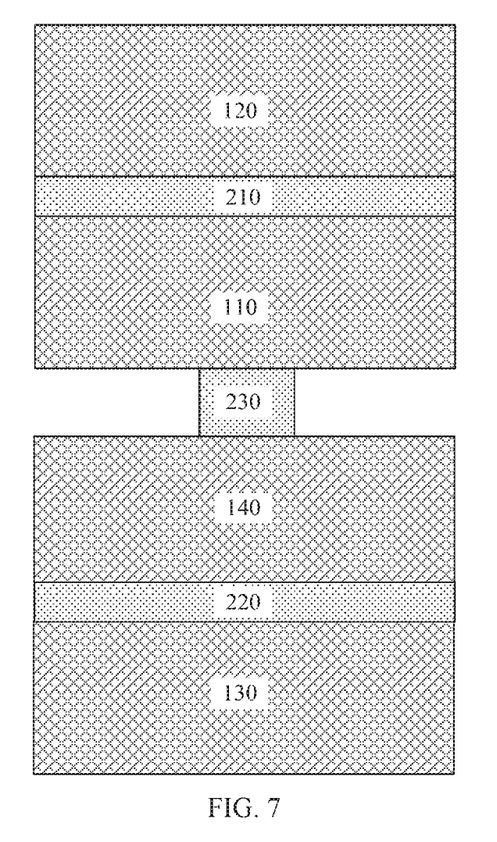
FIG. 7 is a structure diagram of a cover plate in a first unfolded state according to the second embodiment of the present application.

FIG. 7 is a structure diagram of a cover plate in a first unfolded state according to the second embodiment of the present application, wherein the lengths of the deformable regions in the second direction are different. Specifically, the length of the third deformable region 230 is smaller than the first deformable region 210 and the second deformable region 220. In other embodiments, the lengths of the deformable regions in the second direction can be adjusted as needed, and the embodiments in the present application are not to be construed as limiting the present application.

When the memory metal is switched between the high temperature phase and the low temperature phase, tensile stress or compressive stress will be generated in the non-deformable regions connected thereto due to the change in shape. In order to avoid damages to the structure of the cover plate generated by the stress, the present application optimizes the structure of the deformable region to reduce or even eliminate stress due to deformation of the memory metal.

Figure 8:
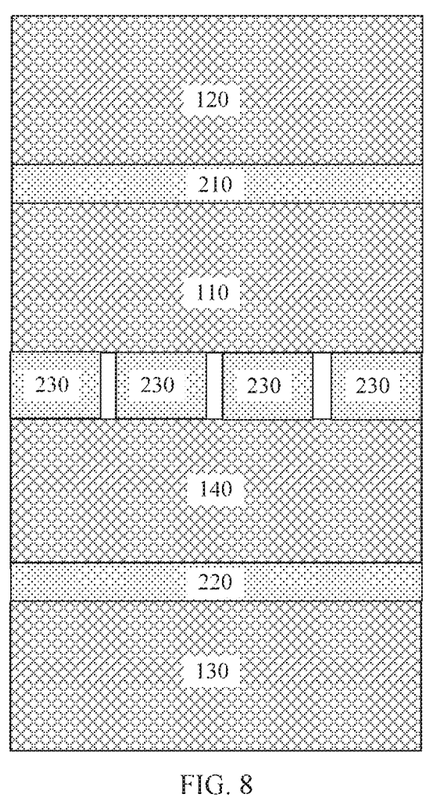
FIG. 8 is a structure diagram of the cover plate in the unfolded state in the third embodiment of the present application.

As shown in FIG. 8, FIG. 8 is a structure diagram of the cover plate in the unfolded state in the third embodiment of the present application, wherein the third deformable region 230 is composed of four sub-deformation regions, and there are gaps between the sub-deformation regions, and the gaps have a width greater than 1 mm. The gaps can release the stress in the second direction of the memory metal as it deforms. In practice, at least one of the first deformable region 210, the second deformable region 220, and the third deformable region 230 is composed of two or more sub-deformed regions.

Figure 9:
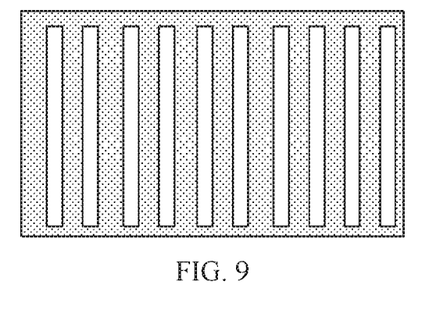
FIG. 9 is a structure diagram of a deformable region in a cover plate in the first embodiment of the present application.

As shown in FIG. 9, FIG. 9 is a structure diagram of a deformable region in a cover plate in the first embodiment of the present application, wherein the memory metal of the deformable regions comprising a fence structure, the fence is oriented parallel to the first direction for releasing stress in the second direction of the memory metal as it deforms. The direction of the fence could also be parallel to the second direction to release stress in the first direction of the memory metal as it deforms.

Figure 10:
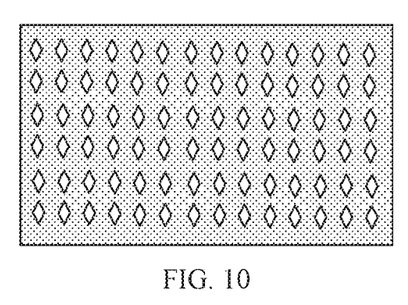
FIG. 10 is a structure diagram of a deformable region in a cover plate according to the second embodiment of the present application.
Figure 11:
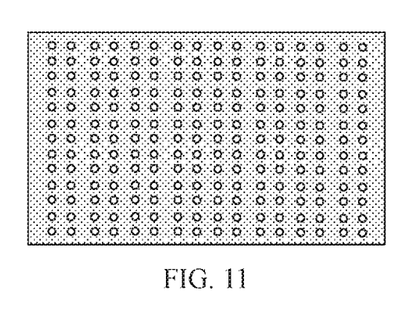
FIG. 11 is a schematic diagram of the structure of a deformable region in a cover plate in the third embodiment of the present application.

As shown in FIG. 10, FIG. 10 is a structure diagram of a deformable region in a cover plate in the second embodiment of the present application, wherein the memory metal of the deformable regions comprising a mesh structure, the mesh structure can release the stress of the memory metal in the first direction and the second direction simultaneously as it deforms, wherein the shape of the mesh is a diamond shape. FIG. 11 is a schematic diagram of the structure of a deformable region in a cover plate in the third embodiment of the present application, wherein the shape of the mesh is circular. In practice, the shape of the mesh can be selected according to the magnitude and direction of the stress released by the memory metal. The shape, size, and density of the mesh cannot be construed as limits of the application.

By using memory metal to form deformable regions in the cover plate, the cover plate of the present application can realize the functions of automatic folding, bending and unfolding of any shape, and can realize complicated deformation that cannot be implemented by other mechanical structures such as hinges. In addition, by adjusting the structure and shape of the memory metal in the deformable region, the stress during deformation of the memory metal is reduced, and the cover structure is further optimized.

As is understood by persons skilled in the art, the foregoing preferred embodiments of the present disclosure are illustrative rather than limiting of the present disclosure. It is intended that they cover various modifications and that similar arrangements be comprised in the spirit and scope of the present disclosure, the scope of which should be accorded the broadest interpretation so as to encompass all such modifications and similar structures.

What is claimed is:

1. A cover plate for a flexible display screen, wherein the cover plate comprises deformable regions and non-deformable regions spaced apart along a first direction, the deformable regions comprising memory metal connecting the non-deformable regions, a number of the non-deformable regions is not less than four; wherein, when the memory metal of the deformable regions is in a low temperature phase shape, the projections of the non-deformable regions at least partially overlaps in a direction perpendicular to the display screen; when the memory metal of the deformable regions is in a high temperature phase shape, the deformable regions and the non-deformable regions are on a same horizontal plane; wherein, the memory metal of the deformable regions comprising a diamond shape mesh structure, wherein at least one of the deformable regions is composed of two or more sub-deformation regions, and having gaps between the sub-deformation regions, wherein from the high temperature phase shape to the low temperature phase shape, the deformable regions bend 180 degrees clockwise or counter-clockwise, and each of the non-deformable regions is parallel with each other on a same direction.

2. The cover plate according to claim 1, wherein, the cover plate comprises at least a first non-deformable region, a first deformable region, a second non-deformable region, a second deformable region, a third non-deformable region, a third deformable region, and a fourth non-deformable region, which are sequentially arranged along the first direction.

3. The cover plate according to claim 2, wherein, when the memory metal of the first deformable region, the second deformable region, and the third deformable region is in a low temperature phase shape, the projections of the first non-deformable region, the second non-deformable region, the third non-deformable region, and the fourth non-deformable region completely overlap in a direction perpendicular to the display screen.

4. The cover plate according to claim 3, wherein, when the memory metal of the first deformable region, the second deformable region, and the third deformable region is in a low temperature phase shape, the first non-deformable region, the second non-deformable region, the third non-deformable region and the fourth non-deformable region are "S"-shaped folded, the first non-deformable region at the head end of the cover plate and the fourth non-deformable region at the tail end of the cover plate are exposed to the outside.

5. The cover plate according to claim 4, wherein the first deformable region, the second deformable region, and the third deformable region have the same length in the first direction.

6. The cover plate according to claim 5, wherein the first deformable region, the second deformable region, and the third deformable region are different in length in the second direction, wherein the second direction is in the same plane with and perpendicular to the first direction.

7. The cover plate according to claim 2, wherein at least one of the first deformable region, the second deformable region, and the third deformable region is composed of two or more of the sub-deformation regions, and the widths of the gaps are greater than 1 mm.

8. A cover plate for a flexible display screen, wherein, the cover plate comprises deformable regions and non-deformable regions spaced apart along a first direction, the deformable regions comprising memory metal for connecting the non-deformable region, the number of the non-deformable regions is not less than four; wherein, when the memory metal of the deformable regions is in a low temperature phase shape, the projections of the non-deformable regions at least partially overlaps in a direction perpendicular to the display screen; when the memory metal of the deformable regions is in a high temperature phase shape, the deformable regions and the non-deformable regions are on a same horizontal plane, wherein, the memory metal of the deformable regions comprising a diamond shape mesh structure, wherein at least one of the deformable regions is composed of two or more sub-deformation regions, and having gaps between the sub-deformation regions, wherein from the high temperature phase shape to the low temperature phase shape, the deformable regions bend 180 degrees clockwise or counter-clockwise, and each of the non-deformable regions is parallel with each other on a same direction.

9. The cover plate according to claim 8, wherein, the cover plate comprises at least a first non-deformable region, a first deformable region, a second non-deformable region, a second deformable region, a third non-deformable region, a third deformable region, and a fourth non-deformable region, which are sequentially arranged along the first direction.

10. The cover plate according to claim 9, wherein, when the memory metal of the first deformable region, the second deformable region, and the third deformable region is in a low temperature phase shape, the projections of the first non-deformable region, the second non-deformable region, the third non-deformable region, and the fourth non-deformable region completely overlap in a direction perpendicular to the display screen.

11. The cover plate according to claim 10, wherein, when the memory metal of the first deformable region, the second deformable region, and the third deformable region is in a low temperature phase shape, the first non-deformable region, the second non-deformable region, the third non-deformable region and the fourth non-deformable region are "S"-shaped folded, the first non-deformable region at the head end of the cover plate and the fourth non-deformable region at the tail end of the cover plate are exposed to the outside.

12. The cover plate according to claim 11, wherein the first deformable region, the second deformable region, and the third deformable region have the same length in the first direction.

13. The cover plate according to claim 4, wherein the first deformable region, the second deformable region, and the third deformable region are different in length in the second direction, wherein the second direction is in the same plane with and perpendicular to the first direction.

14. The cover plate according to claim 9, wherein at least one of the first deformable region, the second deformable region, and the third deformable region is composed of two or more of the sub-deformation regions, and the width of the gaps are greater than 1 mm.

15. The cover plate according to claim 9, wherein the memory metal of the deformable regions comprising a mesh structure and/or a fence structure.

16. A flexible display screen, wherein, comprises a cover plate, the cover plate comprises deformable regions and non-deformable regions spaced apart along a first direction, the deformable regions comprising memory metal for connecting the non-deformable regions, the number of the non-deformable regions is not less than four; wherein, when the memory metal of the deformable regions is in a low temperature phase shape, the projections of the non-deformable regions at least partially overlaps in a direction perpendicular to the display screen; when the memory metal of the deformable regions is in a high temperature phase shape, the deformable regions and the non-deformable regions are on a same horizontal plane, wherein, the memory metal of the deformable regions comprising a diamond shape mesh structure, wherein at least one of the deformable regions is composed of two or more sub-deformation regions, and having gaps between the sub-deformation regions, wherein from the high temperature phase shape to the low temperature phase shape, the deformable regions bend 180 degrees clockwise or counter-clockwise, and each of the non-deformable regions is parallel with each other on a same direction.

* * * * *